(12) United States Patent
Omori et al.

(10) Patent No.: US 11,579,384 B2
(45) Date of Patent: Feb. 14, 2023

(54) LIGHT SOURCE DEVICE, DIRECT DIODE LASER SYSTEM, AND OPTICAL COUPLING DEVICE

(71) Applicant: NICHIA CORPORATION, Anan (JP)

(72) Inventors: Masaki Omori, Toshima-ku (JP); Yuto Oki, Yokohama (JP)

(73) Assignee: NICHIA CORPORATION, Anan (JP)

( * ) Notice: Subject to any disclaimer, the term of this patent is extended or adjusted under 35 U.S.C. 154(b) by 294 days.

(21) Appl. No.: 16/799,485

(22) Filed: Feb. 24, 2020

(65) Prior Publication Data

US 2020/0271872 A1 Aug. 27, 2020

(30) Foreign Application Priority Data

Feb. 25, 2019 (JP) .............................. JP2019-031744

(51) Int. Cl.

| | |
|---|---|
| *H01S 5/40* | (2006.01) |
| *G02B 6/42* | (2006.01) |
| *B23K 26/06* | (2014.01) |
| *G02B 27/10* | (2006.01) |
| *G02B 27/12* | (2006.01) |
| *H01S 5/14* | (2006.01) |

(52) U.S. Cl.
CPC ........ *G02B 6/4206* (2013.01); *B23K 26/0608* (2013.01); *B23K 26/0648* (2013.01); *B23K 26/0665* (2013.01); *G02B 27/1006* (2013.01); *G02B 27/123* (2013.01); *H01S 5/141* (2013.01); *H01S 5/4012* (2013.01); *H01S 5/4062* (2013.01)

(58) Field of Classification Search
CPC .............. G02B 6/4206; G02B 27/1006; G02B 27/123; G02B 6/4296; B23K 26/0608; B23K 26/0648; B23K 26/0665; H01S 5/141; H01S 5/4012; H01S 5/4062; H01S 5/0071; H01S 5/4087; H01S 5/1032
See application file for complete search history.

(56) References Cited

U.S. PATENT DOCUMENTS

| | | | |
|---|---|---|---|
| 6,192,062 B1 | 2/2001 | Sanchez-Rubio et al. | |
| 6,384,981 B1 | 5/2002 | Hauschild | |
| (Continued) | | | |

FOREIGN PATENT DOCUMENTS

| | | |
|---|---|---|
| CN | 101707326 A | 5/2010 |
| CN | 105319649 A | 2/2016 |
| (Continued) | | |

*Primary Examiner* — Xinning(Tom) Niu
(74) *Attorney, Agent, or Firm* — Foley & Lardner LLP

(57) ABSTRACT

A light source device includes an optical fiber; a beam light source configured to coaxially combine laser beams of different peak wavelengths to generate and emit a wavelength-combined beam; and an optical coupling device configured to allow the wavelength-combined beam emitted from the beam light source to be incident on the optical fiber. The optical coupling device includes a first cylindrical lens configured to focus the wavelength-combined beam in a first plane and having a first focal length, a second cylindrical lens configured to focus the wavelength-combined beam in a second plane and having a second focal length, and a third cylindrical lens having a third focal length greater than the first focal length and configured to focus the wavelength-combined beam in the first plane to be incident on the first cylindrical lens.

17 Claims, 9 Drawing Sheets

(56) References Cited

U.S. PATENT DOCUMENTS

| | | |
|---|---|---|
| 2002/0024740 A1 | 2/2002 | Hashimoto |
| 2003/0219189 A1* | 11/2003 | Ishikawa ............... G03F 7/7005 |
| | | 359/204.1 |
| 2004/0101016 A1* | 5/2004 | McDonald .......... H01S 5/02325 |
| | | 372/97 |
| 2005/0063435 A1 | 3/2005 | Imai et al. |
| 2006/0126690 A1 | 6/2006 | Kido et al. |
| 2008/0291950 A1* | 11/2008 | McCallion ............ G02F 1/0147 |
| | | 372/20 |
| 2011/0008973 A1 | 1/2011 | Kawaguchi et al. |
| 2011/0216792 A1* | 9/2011 | Chann .................... H01S 5/405 |
| | | 372/31 |
| 2011/0305250 A1 | 12/2011 | Chann et al. |
| 2012/0057345 A1 | 3/2012 | Kuchibhotla |
| 2013/0084046 A1 | 4/2013 | Yahata et al. |
| 2013/0112667 A1 | 5/2013 | Holmgren et al. |
| 2015/0370173 A1 | 12/2015 | Furuya et al. |
| 2016/0380410 A1 | 12/2016 | Song |
| 2017/0271837 A1* | 9/2017 | Hemenway .......... G02B 27/141 |
| 2018/0314006 A1 | 11/2018 | Tang et al. |
| 2019/0020178 A1* | 1/2019 | Oguri .................... H01S 5/4062 |
| 2019/0288479 A1* | 9/2019 | Kawahara ........... H01S 3/10015 |

FOREIGN PATENT DOCUMENTS

| | | |
|---|---|---|
| JP | 2002-072132 A | 3/2002 |
| JP | 2002-513959 A | 5/2002 |
| JP | 2004-096092 A | 3/2004 |
| JP | 2006-171348 A | 6/2006 |
| JP | 2011-086905 A | 4/2011 |
| JP | 2012-243900 A | 12/2012 |
| JP | 2014-216361 A | 11/2014 |
| JP | 2015-503221 A | 1/2015 |
| JP | 2016-021049 A | 2/2016 |
| JP | 2016-224376 A | 12/2016 |
| WO | WO-2009/087784 A1 | 7/2009 |
| WO | WO-2012/157194 A1 | 11/2012 |

* cited by examiner $BPP = \omega_y \times \theta_y \approx (\lambda/\pi)$ $BPP = \omega_x \times \theta_x = M^2 \times (\lambda/\pi)$

LIGHT SOURCE DEVICE, DIRECT DIODE LASER SYSTEM, AND OPTICAL COUPLING DEVICE

CROSS-REFERENCE TO RELATED APPLICATION

This application claims priority to Japanese Patent Application No. 2019-031744 filed on Feb. 25, 2019, the entire contents of which are hereby incorporated by reference.

BACKGROUND

The present application relates to a light source device, a direct diode laser system, and an optical coupling device.

High-power and high-radiance laser beams are used for performing processing such as cutting, punching, or marking for various kinds of materials, or welding a metal material. Some of the carbon dioxide gas laser apparatuses and YAG solid laser apparatuses that have been used for such laser processing are being replaced by fiber laser apparatuses, which have a high efficiency of energy conversion. Laser diodes (hereinafter simply referred to as LD) are used as pumping light sources of fiber lasers.

According to increase in output of LDs in the recent years, techniques using LDs as light sources of a laser beam directly irradiating a material to process the material, instead of using LDs as pumping light sources, have been developed. Such techniques are referred to as "direct diode laser (DDL) technology".

U.S. Pat. No. 6,192,062 describes an example of a light source device configured to combine a plurality of laser beams of respectively different wavelengths, which have been emitted from a plurality of LDs, to increase the optical output power. Coaxially combining a plurality of laser beams of respective wavelengths, referred to as "wavelength beam combining (WBC)" or "spectral beam combining (SBC)", may be used in enhancing the optical output power and radiance of a DDL system or the like, for example.

SUMMARY

When beams that have been combined through wavelength beam combining are focused onto an optical fiber, the beam quality of the combined beam may deteriorate. There is a demand for a light source device in which such deterioration in beam quality is reduced.

In certain embodiments, a light source device according to the present disclosure includes: an optical fiber; a beam light source configured to coaxially combine a plurality of laser beams of different peak wavelengths to generate and emit a wavelength-combined beam; and an optical coupling device configured to allow the wavelength-combined beam emitted from the beam light source to be incident on the optical fiber. A first beam parameter product of the wavelength-combined beam along a first direction, which is orthogonal to a propagation direction of the wavelength-combined beam, is greater than a second beam parameter product of the wavelength-combined beam along a second direction, which is orthogonal to both the propagation direction and the first direction. The optical coupling device includes a first cylindrical lens configured to focus the wavelength-combined beam in a first plane containing the propagation direction and the first direction, the first cylindrical lens having a first focal length, a second cylindrical lens configured to focus the wavelength-combined beam in a second plane containing the propagation direction and the second direction, the second cylindrical lens having a second focal length, and a third cylindrical lens configured to focus the wavelength-combined beam in the first plane so as to be incident on the first cylindrical lens, the third cylindrical lens having a third focal length which is greater than the first focal length.

In certain embodiments, a direct diode laser system according to the present disclosure includes the light source device described above; and a processing head coupled to the optical fiber of the light source device, the processing head irradiating a target object with the wavelength-combined beam emitted from the optical fiber.

In certain embodiments, an optical coupling device according to the present disclosure is configured to allow a combined beam into which a plurality of laser beams have been combined to be incident on an optical fiber, in which a first beam parameter product of the combined beam along a first direction, which is orthogonal to a propagation direction of the combined beam, is greater than a second beam parameter product of the combined beam along a second direction, which is orthogonal to both the propagation direction and the first direction. The optical coupling device includes a first cylindrical lens configured to focus the combined beam in a first plane containing the propagation direction and the first direction, the first cylindrical lens having a first focal length; a second cylindrical lens configured to focus the combined beam in a second plane containing the propagation direction and the second direction, the second cylindrical lens having a second focal length; and a third cylindrical lens configured to focus the combined beam in the first plane so as to be incident on the first cylindrical lens, the third cylindrical lens having a third focal length greater than the first focal length.

According to certain embodiments of the present disclosure, a light source device and a direct diode laser system in each of which deterioration in beam quality is reduced, and an optical coupling device used in such light source devices can be provided.

DETAILED DESCRIPTION

Before describing embodiments of the present disclosure, findings that were made by the inventors and the technological background thereof will be described.

Figure 1:
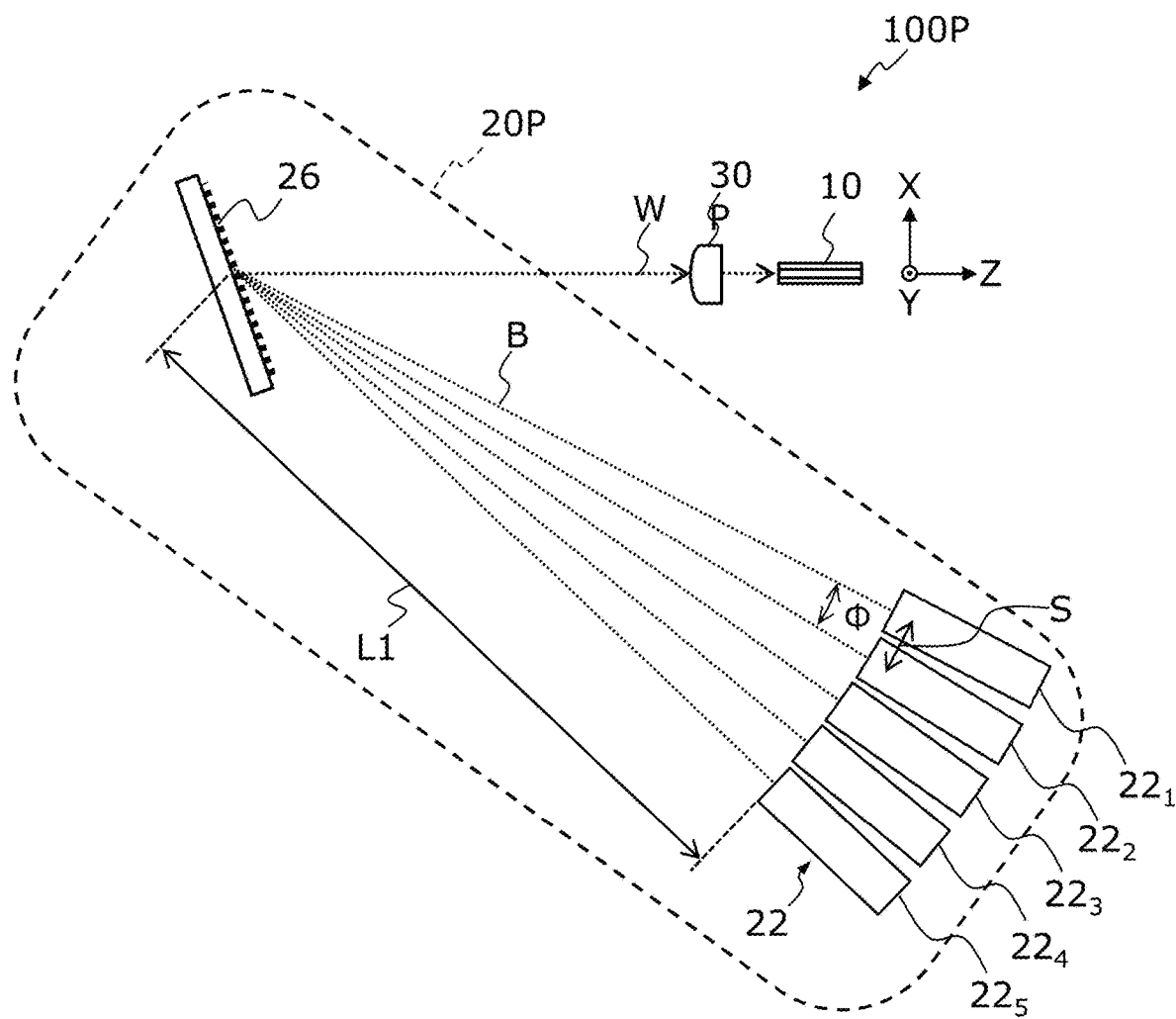
FIG. 1 is a diagram showing an example of the structure of a light source device in which laser beams which have been combined through wavelength beam combining are focused onto an optical fiber.

An example of a basic structure of a light source device configured to perform "wavelength beam combining (WBC)" will be described below. FIG. 1 is a diagram showing an example of the structure of a light source device in which laser beams which have been combined through WBC onto an optical fiber are focused. For reference, an XYZ coordinate system based on an X axis, a Y axis, and a Z axis, which are orthogonal to one another, is schematically shown in the drawings including FIG. 1.

The light source device 100P shown in FIG. 1 includes an optical fiber 10, a beam light source 20P, and an optical coupling device 30P. The beam light source 20P coaxially combines a plurality of laser beams B of different peak wavelengths $\lambda$ to generate and emit a wavelength-combined beam W. In the present disclosure, the term "wavelength-combined beam" refers to a laser beam in which a plurality of laser beams B of different peak wavelengths $\lambda$ are coaxially combined through WBC. With the WBC technique, n laser beams of different peak wavelengths $\lambda$ are coaxially combined, so that not only the optical output power but also the fluence (unit: W/cm$^2$) can be increased to about n times the fluence of each individual laser beam B.

In the example shown in FIG. 1, the beam light source 20P includes a plurality of laser modules 22 configured to emit a plurality of laser beams B of different peak wavelengths $\lambda$, and a beam combiner 26 configured to combine the plurality of laser beams B to generate a wavelength-combined beam W. FIG. 1 illustrates five laser modules 22$_1$ through 22$_5$.

In the example shown in FIG. 1, the beam combiner 26 is a reflection-type diffraction grating.

Components other than a diffraction grating may be employed for the beam combiner 26, and the beam combiner 26 may also be another wavelength-dispersion optical element, for example, a prism.

The laser beams B are incident on the reflection-type diffraction grating at different angles, and all of minus-first order reflection-diffracted light of the laser beams B are emitted in the same direction. In FIG. 1, for simplicity, the center axis of each laser beam B and the center axis of the wavelength-combined beam W are illustrated to indicate each laser beam B and the wavelength-combined beam W. The wavelength-combined beam W emitted from the beam light source 20P is focused by the optical coupling device 30P, so as to be incident on the core of the optical fiber 10.

In the example of FIG. 1, the Y axis is parallel with the viewing direction of FIG. 1, and FIG. 1 schematically shows a view parallel to the XZ plane of the light source device 100P. The propagation direction of the wavelength-combined beam W is parallel to the Z axis direction.

As used herein, the distance from each laser module 22 to the reflection-type diffraction grating (beam combiner 26) is indicated by L1, and the angle between two adjacent laser modules 22, i.e., the angle between two adjacent laser beams B, is indicated by $\Phi$ (radian: rad). In the example shown in FIG. 1, the distance L1 and the angle $\Phi$ are uniform among the laser modules 22$_1$ through 22$_5$. Assuming that the arrangement pitch (intervals between emitters) of the laser modules 22 is S, an approximate expression $\Phi \times L1 = S$ holds true.

Figure 2:
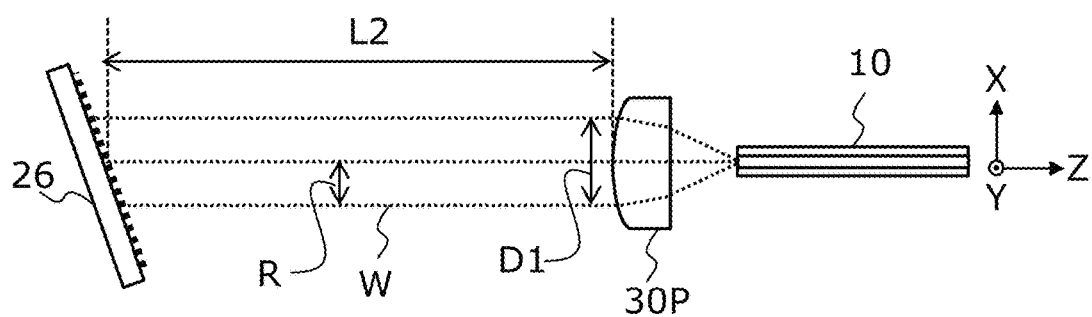
FIG. 2 is a diagram schematically showing focusing of a wavelength-combined beam W onto an optical fiber 10 by an optical coupling device 30P.

FIG. 2 is a diagram schematically showing how a wavelength-combined beam W emitted from the beam combiner 26 may be focused by the optical coupling device 30P onto the optical fiber 10. An example of the optical coupling device 30P is a converging lens. For simplicity, the wavelength-combined beam W is schematically represented by three rays. Among the three rays, the middle ray is on the optical axis of the lens, while the other two rays schematically represent positions that would together define the beam diameter. The beam diameter may be defined by the size of a region having an optical intensity of, e.g., $1/e^2$ or more relative to the optical intensity in the beam center. Herein, e is Napier's constant (about 2.71). The beam diameter and the beam radius may alternatively be defined according to other criteria.

In FIG. 2, the wavelength-combined beam W is illustrated as a parallel collimated beam, and a diameter (incident beam diameter) of the wavelength-combined beam W along the X axis direction in a region incident on the optical coupling device 30P is denoted as D1. In actuality, however, the wavelength-combined beam W propagating along the Z axis direction is not perfectly parallel light; the beam radius R of the wavelength-combined beam W is not uniform, but rather is a function of position on the optical path (i.e., the coordinate value z on the Z axis) or optical path length. Moreover, the size of the beam radius R of the wavelength-combined beam W may be varied in the Y axis direction and the X axis direction. Therefore, in a strict sense, it would be appropriate to denote its beam radius along the Y axis direction as $R_Y(z)$ and its beam radius along the X axis direction as $R_X(z)$.

Because the wavelength-combined beam W results from coaxial and spatial overlapping of the individual laser beams B, the beam radius R and the divergence half angle $\theta$ of the wavelength-combined beam W can be approximated as the beam radius $\omega$ and the divergence half angle $\theta$, respectively, of the individual laser beam B emitted from each laser module 22.

In FIG. 2, the distance from the reflection-type diffraction grating (beam combiner 26) to the optical coupling device 30P is denoted as L2. The distance L2 may be set in a range of 100 to 500 mm, for example. Moreover, the distance L1 shown in FIG. 1 is, e.g., about 2000 mm or more. The angle $\Phi$ and pitch S that define this distance L1 are restricted by the wavelength of the laser beam B, the structure and performance of the beam combiner 26, structure and size of each laser module 22, etc., and are difficult to be substantially reduced. Hereinafter, L1+L2 may be referred to as the "optical path length".

It has been found through a study by the inventors that the example of the structure described above has a problem in that the focus beam diameter obtained by the optical coupling device 30P may exceed the core diameter of the optical fiber 10. If the focus beam diameter is larger than the core diameter of the optical fiber 10, the efficiency of optical coupling to the optical fiber 10 may be decreased, thus deteriorating the optical output power and beam quality of the laser beam emitted from the optical fiber 10. There are possibilities of thermal damage on the fiber covering and fiber-holding elements. Through a vigorous study, the inventors have found a cause thereof to be the long optical path length (L1+L2), which allows the incident beam diameter D1 on the optical coupling device 30P to expand in the X axis direction, thus leading to a spherical aberration that causes a deterioration in beam quality.

Basic Structure of Light Source Device According to Present Disclosure

Figure 3A:
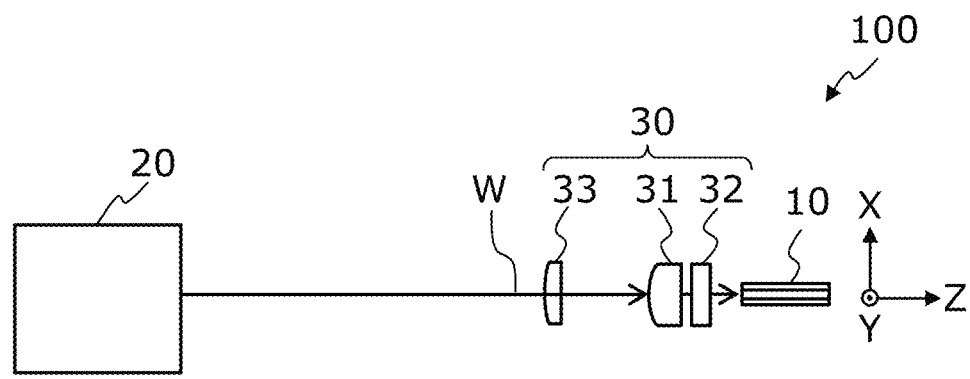
FIG. 3A is a cross-sectional view schematically showing an example of the structure of a light source device 100 according to the present disclosure.
Figure 3B:
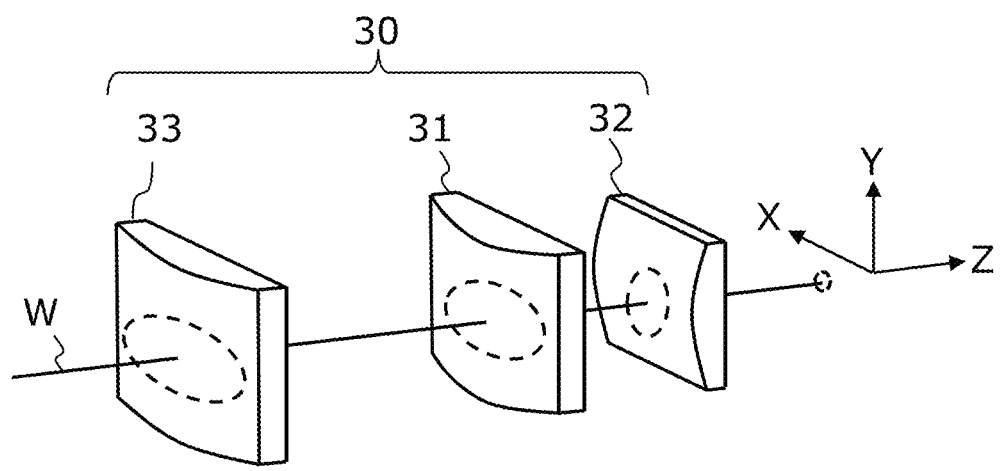
FIG. 3B is perspective view schematically showing an example of the structure of an optical coupling device 30 included in the light source device 100.

With reference to FIG. 3A and FIG. 3B, an example of the basic structure of a light source device 100 according to the present disclosure will be described. FIG. 3A is a cross-sectional view schematically showing an example of the structure of the light source device 100 on the XZ plane. FIG. 3B is a perspective view schematically showing an example of the structure of an optical coupling device 30 included in the light source device 100.

The light source device 100 shown in FIG. 3A includes an optical fiber 10, a beam light source 20 configured to generate and emit a wavelength-combined beam W, and an optical coupling device 30 configured to allow the wavelength-combined beam W emitted from the beam light source 20 to be incident on the optical fiber 10. A first beam parameter product (first BPP) of the wavelength-combined beam W along a first direction (the X axis direction), which is orthogonal to the propagation direction (the Z axis direction) of the wavelength-combined beam W, is greater than a second BPP of the wavelength-combined beam W along a second direction (the Y axis direction), which is orthogonal to both the propagation direction and the first direction. BPP is an index for quantitatively assessing beam quality. The more the beam quality is deteriorated, the greater the value of BPP is. Details of BPP will be described below.

As shown in FIG. 3B, the optical coupling device 30 includes: a first cylindrical lens 31 that focuses the wavelength-combined beam W in a first plane (XZ) which contains the propagation direction and the first direction (the X axis direction); a second cylindrical lens 32 that focuses the wavelength-combined beam W in a second plane (YZ) which contains the propagation direction and the second direction (the Y axis direction); and a third cylindrical lens (additional-converging lens) 33 that focuses the wavelength-combined beam W in the first plane (XZ) so that it is incident on the first cylindrical lens 31. The cylindrical lens has a curved surface to converge a parallel bundle of rays onto a straight line (focal point). The curved surface of the cylindrical lens has a shape corresponding to a portion of the outer peripheral surface of a circular cylinder, and the cylindrical lens has a curvature in a direction corresponding to an axial direction of the corresponding circular cylinder is zero. Each curve (broken line) in FIG. 3B schematically represents a beam cross-sectional shape of the respective lens 31, 32, 33 on the incident surface.

Due to the action of the third cylindrical lens 33, the optical coupling device 30 according to the present disclosure suppresses a decrease in beam quality, which allows for solving the problem described below. Hereinafter, the structure and operation of the light source device 100 according to certain embodiments of the present disclosure will be described in detail.

Embodiment

Light Source Device

Figure 4:
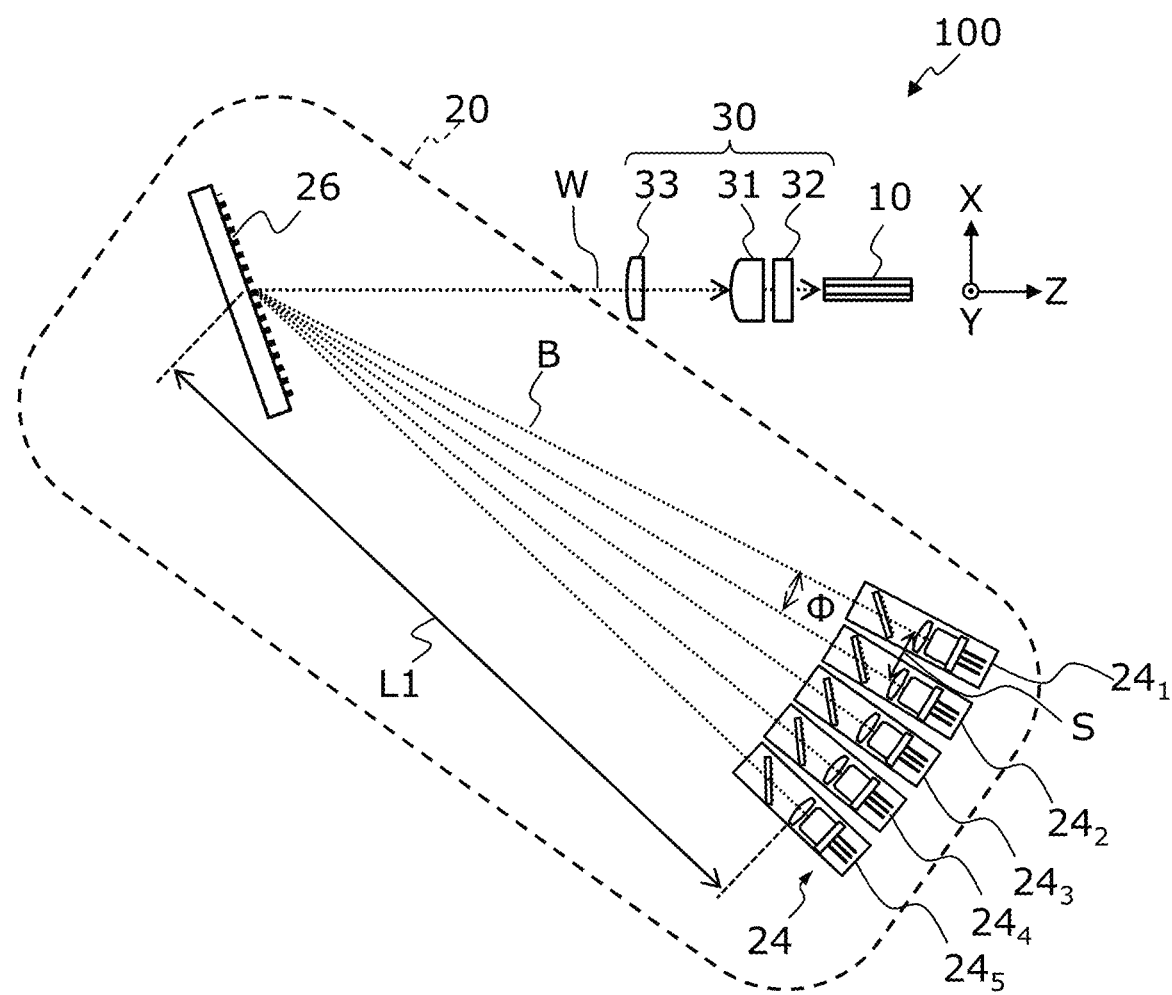
FIG. 4 is a diagram showing an example of the structure of a light source device 100 according to one embodiment of the present disclosure.

FIG. 4 is a diagram showing an example of the structure of a light source device 100 according to one embodiment of the present disclosure. The light source device 100 shown in FIG. 4 includes an optical fiber 10, a beam light source 20, and an optical coupling device 30. The beam light source 20 is configured to coaxially combine a plurality of laser beams B of different peak wavelengths $\lambda$, to generate and emit a wavelength-combined beam W.

The beam light source 20 includes a plurality of laser modules 24 configured to respectively emit a plurality of laser beams B, and a beam combiner 26 configured to combine the plurality of laser beams B to generate the wavelength-combined beam W. The laser modules 24 according to the present embodiment are of an external cavity type. FIG. 4 shows five laser modules $24_1$ to $24_5$. The laser modules $24_1$ to $24_5$ emit laser beams B of peak wavelengths $\lambda_1$ to $\lambda_5$, respectively. Herein, the relationship $\lambda_1<\lambda_2<\lambda_3<\lambda_4<\lambda_5$ holds true. The number of laser modules 24 that are included in the beam light source 20 may be other than five, and, for example, six or more laser modules 24 may be employed.

In the present embodiment, the peak wavelengths of adjacent laser beams B differ by $\delta\lambda(\lambda_{n+1}-\lambda_n=\delta\lambda)$, and the angle $\Phi$ between adjacent laser beams B is about 0.4 degrees, i.e. about 7 milliradians (mrad). Moreover, the arraying pitch S of the laser modules 24 is about 10 millimeters (mm). When such examples of values are employed, from the approximate expression $\Phi \times L1=S$, the distance L1 is determined to be about 1500 mm. In order to efficiently accommodate component elements in a limited space, one or more mirrors may be inserted between the laser module(s) 24 and the beam combiner 26, and the propagation direction of each laser beam B may be rotated using such a mirror.

Figure 5:
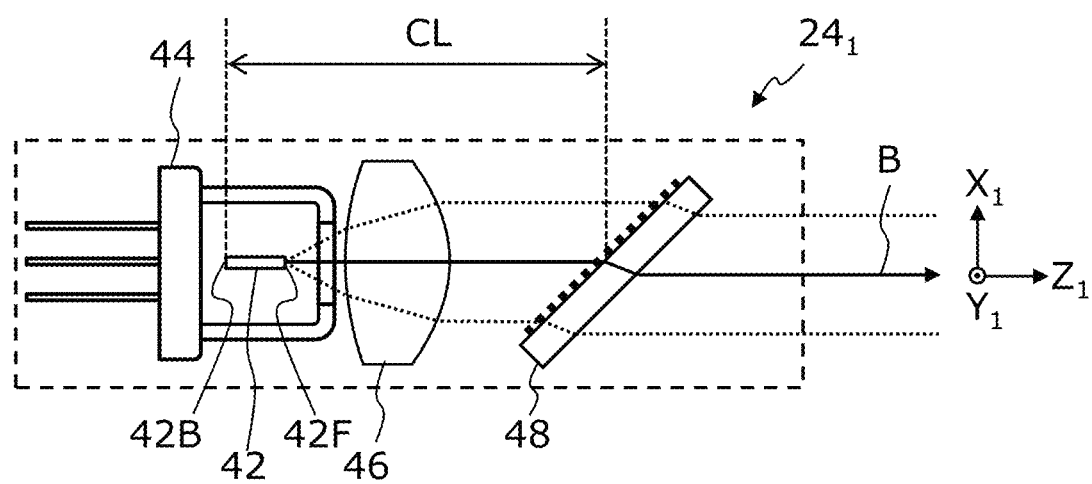
FIG. 5 is a cross-sectional view showing an example of the structure of an external cavity laser module 24 used in the present embodiment.
Figure 6:
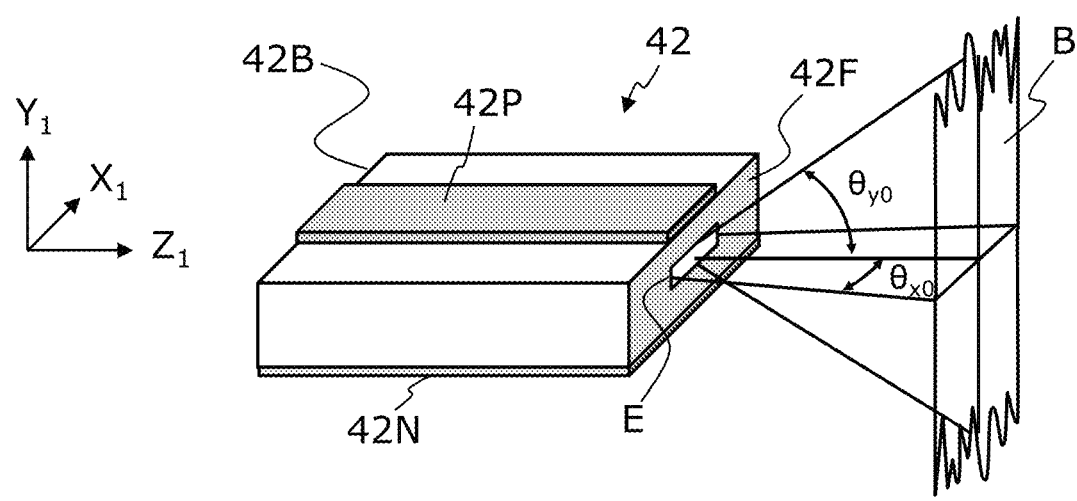
FIG. 6 is a perspective view showing an example of a basic structure of an LD 42.

Next, with reference to FIG. 5 and FIG. 6, a specific example of the structure of the external cavity laser modules 24 will be described. FIG. 5 is a cross-sectional view showing one example of the structure of the external cavity laser module $24_1$. The other external cavity laser modules $24_2$ to $24_5$ have structures similar that of the external cavity laser module $24_1$. For reference, an $X_1Y_1Z_1$ coordinate system which is based on an $X_1$ axis, a $Y_1$ axis, and a $Z_1$ axis which are orthogonal to one another is schematically shown in FIG. 5 and FIG. 6. This $X_1Y_1Z_1$ coordinate system defines local coordinates that are attached to the laser module $24_1$. Although it is convenient that the origin of the $X_1Y_1Z_1$ coordinate system is illustrated at a position that coincides with the origin of the laser beam B in the laser module $24_1$, the origin of the $X_1Y_1Z_1$ coordinate system is depicted at a location spaced apart from the emitter for ease of illustration. The $Z_1$ axis is parallel to the propagation direction (beam center axis) of the laser beam B.

The external cavity laser module $24_1$ in FIG. 5 has an external cavity structure that includes a laser diode 42 as a light source or an optical gain element (gain medium). Hereinafter, a laser diode will simply be referred to as an "LD".

In an embodiment of the present disclosure, the LD 42 may be mounted in a semiconductor laser package (hereinafter simply referred to as a "package") 44 that is sealed airtight. The package 44 includes a stem having a lead terminal and a metal cap covering the LD 42 that has been fixed to the stem, with a light-transmitting window member being attached to the metal cap. Any appropriate structure may be employed for the package 44, and for example, the package 44 may be a TO-CAN type package of e.g., Φ5.6 mm or Φ9 mm. An example of the window member is a thin plate made of optical glass (refractive index: 1.4 or more). The inside of the package 44 is filled with an inert gas, e.g., a nitrogen gas of high cleanliness or a noble gas, and the package 44 may be sealed airtight. In general, if an LD 42 which emits a laser beam of a wavelength that is shorter than the near-infrared region are employed and their optical output power is increased, dust or the like in the ambient may adhere to the emitter region during operation owing to the optical trapping or optical dust attraction effect, thus possibly lowering the optical output power. Other substance may also adhere to the emitter region, and may be a deposit that is generated by chemical reaction of volatilized organic matter with the laser beam. The shorter the wavelength of the laser beam is and the higher the optical output power is, the greater the deterioration associated with adhering matter is. In order to avoid this problem, when the plurality of LDs 42 are to be accommodated in a housing of the light source device 100, the housing may be assembled such that dust does not enter the housing, and the housing may be sealed. However, there may be cases where dust or the like adheres to the lens system, diffraction gratings, or other parts that are necessary for wavelength beam combining, and also it is difficult to enhance airtightness of the entire housing. In the present embodiment, each LD 42 is accommodated in a sealed semiconductor laser package.

Technology for packaging LDs has been advanced, which allows for realizing highly reliable operation over long periods of time.

For the LD 42, for example, a semiconductor laser element configured to emit laser light of near-ultraviolet, violet, blue, or green and made of a nitride semiconductor-based material can be used. The LD 42 may be secured to the stem via a submount having a high thermal conductivity. The LD 42 may be oriented in a direction other than the example shown in the drawings, and the LD 42 may be oriented such that laser light therefrom is reflected along the Z axis direction by a mirror in the package 44.

FIG. 6 is a perspective view schematically showing an example of a basic structure of the LD 42. The structure shown in FIG. 6 is simplified for explanation. In the example of FIG. 6, the LD 42 includes a stripe-shaped p-electrode 42P which is formed on an upper surface, an n-electrode 42N which is formed on a lower surface, and an emitter region E which is located on an end surface 42F. The laser beam B is emitted from the emitter region E. The LD 42 includes a semiconductor substrate and a plurality of semiconductor layers (a semiconductor multilayer structure) that are grown on the semiconductor substrate. The semiconductor multilayer structure includes an emission layer, and may have various known structures. In this example, the emitter region E has a size along the X axis direction, that is, an X-axis size, (e.g. about 15 μm) much larger than a size of the emitter region E along the Y axis direction, that is, a Y-axis size (e.g. about 1.5 μm). The Y-axis size of the emitter region E is defined by the semiconductor multilayer structure (more specifically, thicknesses of the waveguide and the cladding layers, refractive index ratio, etc.) of the LD 42. The X-axis size of the emitter region E is defined by the X-axis size of a region in which an electric current flows in a direction crossing the emission layer, or specifically, by the width (gain waveguide width) of a ridge structure (not shown) and so on.

The end face 42F of the LD 42 according to the present embodiment is provided with an antireflection coating. The other end surface 42B of the LD 42 is provided with a high-reflectance film. Accordingly, the region that is indicated by a distance CL in FIG. 5 forms a cavity, the distance CL defining the cavity length. As will be described below, a portion of the laser beam B that is emitted from the LD 42 is diffracted by a transmission diffraction grating 48 so as to return to the LD 42. A standing wave of a single longitudinal mode having a predetermined wavelength is generated between the high-reflectance film on the end surface 42B of the LD 42 and the transmission diffraction grating 48. A portion of the cavity that is located outside the LD 42 is referred to as an "external cavity". The illustrated configuration is a Littrow configuration. A Littrow configuration does not need a mirror, which would be required in a Littman configuration, which is not shown. With a Littrow configuration having the transmission diffraction grating 48, the cavity length CL can be reduced, and it is easier to stabilize the resonance mode. In the present embodiment, the cavity length CL is in a range of 25 to 35 mm, for example.

As shown in FIG. 6, the beam shape of the laser beam B that is emitted from the emitter region E is asymmetric between the X axis direction and the Y axis direction. A far field pattern of the laser beam B is schematically shown in FIG. 6. The laser beam B has a beam shape that approximates a single-mode Gaussian beam along the Y axis direction, and has a multi-mode beam shape with a small divergence angle as a whole along the X axis direction. The divergence half angle $\theta_{y0}$ along the Y axis direction is greater than the divergence half angle $\theta_{x0}$ along the X axis direction. In the Y axis direction, the laser beam B can be approximated as a Gaussian beam. Therefore, given a beam radius $\omega_o$ at the beam waist along the Y axis direction and a wavelength $\lambda$ of the laser beam B, then $\theta_{y0}=\tan^{-1}(\lambda/\Pi\omega_o)\approx\lambda/(\Pi\omega_o)$ radians holds true. In the case where $\lambda$ is in the visible light region, $\theta_{y0}$ may be e.g., 20 degrees, and $\theta_{x0}$ may be e.g., 5 degrees.

Accordingly, the Y-axis size of the laser beam B increases, while relatively "rapidly" diverging, during propagation along the Z axis direction.

Thus, the Y axis is called "the fast axis", and the X axis "the slow axis". Because the laser beam B has a multi-mode beam shape along the slow-axis direction, the beam quality along the slow-axis direction is reduced relative to the beam quality along the fast-axis direction. Accordingly, the Beam Parameter Product (BPP) indicating beam quality is relatively larger along the slow-axis direction, relative to that along the fast-axis direction.

BPP is a multiplication product between the beam waist radius and the divergence half angle in a far field.

This will be described below in detail.

As used in the present disclosure, the terms "fast axis direction" and "slow axis direction", when referring to each individual LD 42, respectively refers to a $Y_1$ axis and an $X_1$ axis in an $X_1Y_1Z_1$ coordinate system for each LD 42. When referring to the wavelength-combined beam W, the terms "fast axis direction" and "slow axis direction" respectively refers to "the Y axis direction" and "the X axis direction" in the global XYZ coordinate system.

In other words, in a cross section that is orthogonal to the propagation direction of a laser beam, the direction along which BPP is the lowest refers to "the fast axis", and the direction that is orthogonal to the fast axis refers to "the slow axis".

FIG. 5 is referred to again. The illustrated laser module $24_1$ includes a collimator lens 46 configured to collimate a laser beam B which is emitted from the LD 42. The collimator lens 46 is a spherical lens, for example. In the form of a bundle of approximately parallel rays, the laser beam B which has been transmitted through the collimator lens 46 is incident on the transmission diffraction grating 48.

Figure 7A:
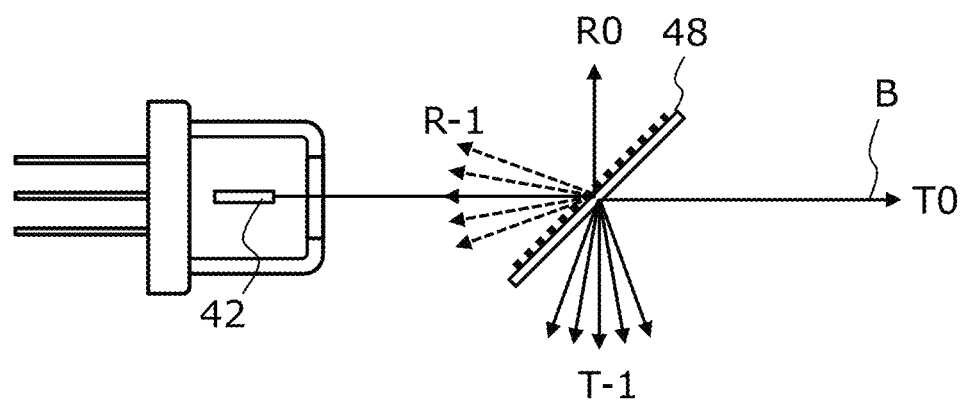
FIG. 7A is a cross-sectional view schematically showing the action of a transmission diffraction grating 48.
Figure 7B:
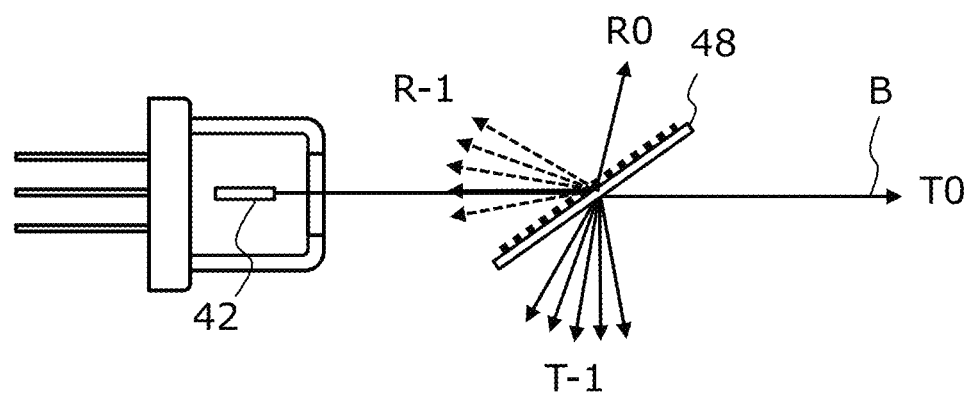
FIG. 7B is a cross-sectional view schematically showing the action of the transmission diffraction grating 48.

Each of FIG. 7A and FIG. 7B is a cross-sectional view schematically showing diffraction of the laser beam B by the transmission diffraction grating 48. A difference between FIG. 7A and FIG. 7B is the tilt angle of the transmission diffraction grating 48. In these figures, for simplicity, illustration of the collimator lens 46 is omitted, and the laser beam B and the diffracted light are also represented as straight lines.

Laser beam is incident on the transmission diffraction grating 48 in the example in these drawings to obtain, mainly, $0^{th}$ order transmission-diffracted light T0, $0^{th}$ order reflection-diffracted light R0, $-1^{st}$ order transmission-diffracted light T-1, and $-1^{st}$ order reflection-diffracted light R-1. The $-1^{st}$ order diffracted light T-1 and R-1 are emitted from the transmission diffraction grating 48 at different angles in accordance with their wavelengths.

Of these diffracted light beams, it is the $-1^{st}$ order reflection-diffracted light R-1 that returns to the LD 42. When the Littman configuration described above is employed, the $-1^{st}$ order reflection-diffracted light R-1 will be reflected by a mirror not shown, and thereafter return to the LD 42 again through the transmission diffraction grating 48. Therefore, a Littman configuration may increase the cavity length, thus reducing the stability of the longitudinal mode.

In FIG. 7A and FIG. 7B five rays are schematically shown for each of $-1^{st}$ order diffracted light T-1 and R-1. These five rays are five imaginary $-1^{st}$ order diffracted rays of mutually different wavelengths. In actuality, a single standing wave of the longitudinal mode will be created within a cavity in which laser oscillation occurs, and only the diffracted ray(s) that has the wavelength of this standing wave will return to the LD 42 so as to contribute to laser oscillation. When the tilt angle of the transmission diffraction grating 48 changes, the wavelength of the $-1^{st}$ order reflection-diffracted light R-1 to return to the LD 42 is shifted.

Adjustment the tilt angle of the transmission diffraction grating 48 allows selection the wavelength of laser oscillation. Even when the tilt angle of the transmission diffraction grating 48 is constant, similar effects can be obtained by adjusting the grating pitch of the transmission diffraction grating 48.

In one example, the transmission diffraction grating 48 may be configured so that, within a beam of a predetermined wavelength (e.g. about 410 nm) which is incident at a predetermined angle (40 to 50 degrees), the $0^{th}$ order transmission-diffracted light T0 accounts for e.g. about 50% or more, that the $-1^{st}$ order reflection-diffracted light R-1 accounts for e.g. about 25%, and that a total of the $0^{th}$ order reflection-diffracted light R0 and the $-1^{st}$ order transmission-diffracted light T-1 accounts for e.g. about 25% or less.

Figure 8:
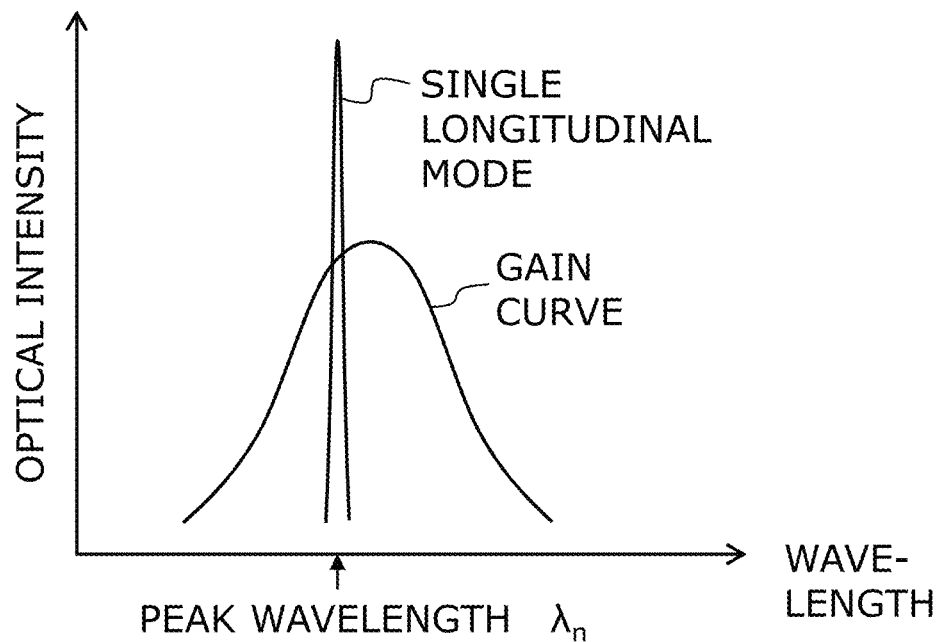
FIG. 8 is a diagram schematically showing a gain curve of the LD 42 and a spectrum of a laser beam B which is emitted from an external cavity laser module 24 that is lasing in a single longitudinal mode at a certain wavelength $\lambda_n$.

FIG. 8 is a diagram schematically showing a gain curve (i.e., a curve representing wavelength dependence of gain) of the LD 42 and a spectrum of a laser beam B which is emitted from an external cavity laser module 24 that is lasing in a single longitudinal mode at a certain wavelength $\lambda_n$. The wavelength (peak wavelength $\lambda_n$) of the laser beam B is selected from a wavelength range with a gain that allows laser oscillation.

With the external cavity structure, the laser beam B has a narrow spectral width, presenting a sharp peak.

According to one embodiment of the present disclosure, a plurality of LDs 42 configured to have gains that allow laser oscillation in a wavelength range that includes, e.g., a range of 400 to 420 nm. In other words, a plurality of LDs 42 having a gain spectral width of about 20 nm, such that the largest gain is obtained at a wavelength of 410 nm, are provided. Then, the structure and tilt angle of the transmission diffraction grating 48 are adjusted so that the minus-first order reflection-diffracted lights R-1 returning from the transmission diffraction grating 48 to the respective LDs 42 will have wavelengths different from each other by several nm. Using the external cavity laser modules 24 allows the laser beams to have a narrow spectral width, and lasing wavelengths of the laser beams to be stable. As a result, using the beam combiner 26, e.g. a diffraction grating, a plurality of laser beams can be coaxially combined in a desired direction, with a high precision.

The plurality of laser beams B of different peak wavelengths $\lambda_n$ thus obtained are coaxially combined through wavelength beam combining, to create the wavelength-combined beam W.

LDs 42 of an identical gain spectral width (e.g. a wavelength range from 20 to 30 nm) generally have semiconductor multilayer structures that are made of a semiconductor of an identical composition.

In embodiments of the present disclosure, other appropriate configurations may also be employed. For example, the LDs 42 may include a laser diode(s) including a light emission layer with a semiconductor composition different from that of other laser diode(s) of LDs 42, such that its gain spectral range is not the same. More specifically, for example, a plurality of laser beams B having peak wavelengths in at least one of the color ranges of ultraviolet, violet, blue, and green may be combined in any appropriate manner, so that a wavelength-combined beam W of various spectra can be created.

Figure 9:
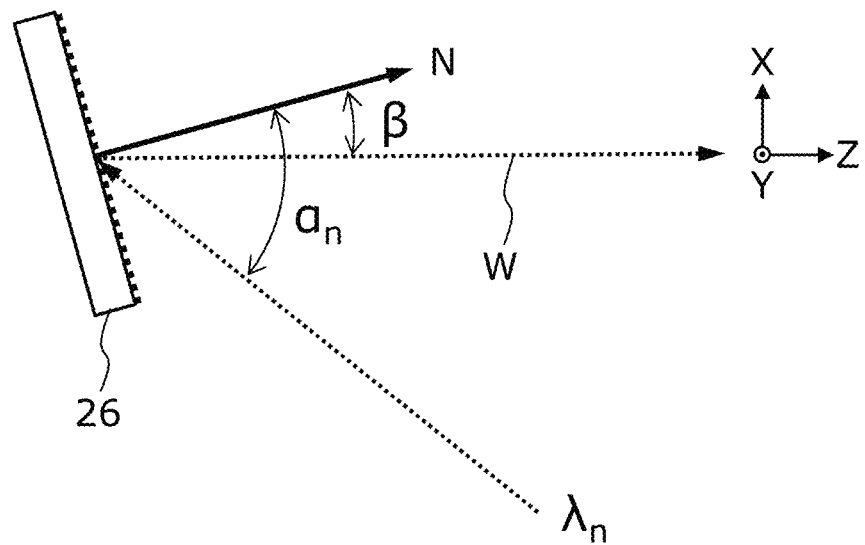
FIG. 9 is a diagram showing the action of a reflection-type diffraction grating which is included in a beam light source 20 as a beam combiner 26 and serves as according to the present embodiment.

FIG. 9 is a diagram showing the action of a reflection-type diffraction grating which is included in the beam light source 20 and serves as the beam combiner 26 according to the present embodiment. A laser beam B of a peak wavelength $\lambda_n$ is incident on the beam combiner 26 at an incident angle $\alpha_n$ relative to the normal direction N of the beam combiner 26. The $-1^{st}$ order reflection-diffracted light is incident in the Z axis direction, at a diffraction angle $\beta$. In this case, the equation $\sin \alpha_n + \sin \beta = K \cdot m \cdot \lambda_n$ holds true.

Herein, K is the number of diffraction gratings per millimeter of the beam combiner 26, and m is the number of diffraction order.

As described above, in the present embodiment, laser beams B of mutually different peak wavelengths $\alpha_n$ are emitted from external cavity laser modules 24, and are incident on the beam combiner 26 at appropriate incident angles $\alpha_n$. Accordingly, laser beams B that are diffracted by an identical diffraction angle $\beta$ are spatially overlapped, whereby wavelength beam combining is achieved.

In one Example, eleven external cavity laser modules 24 which were adapted to emit laser beams having peak wavelengths $\lambda_n$ as shown in Table 1 below were provided, these being aligned so as to realize incident angles $\alpha_n$ and a diffraction angle $\beta$ as shown in Table 1. In the resultant light source device, eleven laser beams of different peak wavelengths, all emitted at the same diffraction angle β from the beam combiner (reflection-type diffraction grating) 26, were coaxially combined to generate a single wavelength-combined beam. In this example, K was 2222 mm$^{-1}$, and the optical path length (L1+L2) was about 1800 mm.

TABLE 1

| module # n | peak wavelength $\lambda_n$ (nm) | incident angle α | diffraction angle β |
|---|---|---|---|
| 1 | 399.13 | 42.90 | 11.90 |
| 2 | 401.53 | 43.32 | 11.90 |
| 3 | 403.93 | 43.74 | 11.90 |
| 4 | 406.30 | 44.16 | 11.90 |
| 5 | 408.66 | 44.58 | 11.90 |
| 6 | 411.00 | 45.00 | 11.90 |
| 7 | 413.32 | 45.42 | 11.90 |
| 8 | 415.63 | 45.84 | 11.90 |
| 9 | 417.92 | 46.26 | 11.90 |
| 10 | 420.19 | 46.68 | 11.90 |
| 11 | 422.45 | 47.10 | 11.90 |

In this Example, LDs 42 having gain at wavelengths in a range of about 399 to 422 nm are used. In other words, the gain spectral width Δλ is about 23 nm. As is clear from Table 1, there exists a wavelength difference δλ of about 2.3 nm between the peak wavelength $\lambda_n$ of a laser beam which is emitted from an n$^{th}$ laser module 24$_n$ and the peak wavelength $\lambda_{n+1}$ of a laser beam which is emitted from an n+1$^{th}$ laser module 24$_{n+1}$. Moreover, there exists an angle difference of about 4.2 degrees between the incident angle $\alpha_n$ of a laser beam which is emitted from an n$^{th}$ laser module 24$_n$ and the incident angle $\alpha_{n+1}$ of a laser beam which is emitted from an n+1$^{th}$ laser module 24$_{n+1}$.

Any appropriate configurations other than those described in the example above may be employed in embodiments according to the present disclosure. Using a plurality of LDs having a gain spectral width of, e.g., several tens of nanometers selected from within a wavelength range of, e.g., 350 to 550 nm, wavelength beam combining can be achieved in a various wavelength bands. In a wavelength range of 350 to 550 nm, metals such as copper has a high absorptance, and accordingly, a wavelength-combined beam that is suitable for metal machining can be obtained.

The wavelength-combined beam W emitted from the beam light source 20 having the structure described above has a beam quality asymmetric between the Y axis (fast axis) direction and the X axis (slow axis) direction. This will be described below.

Figure 10A:
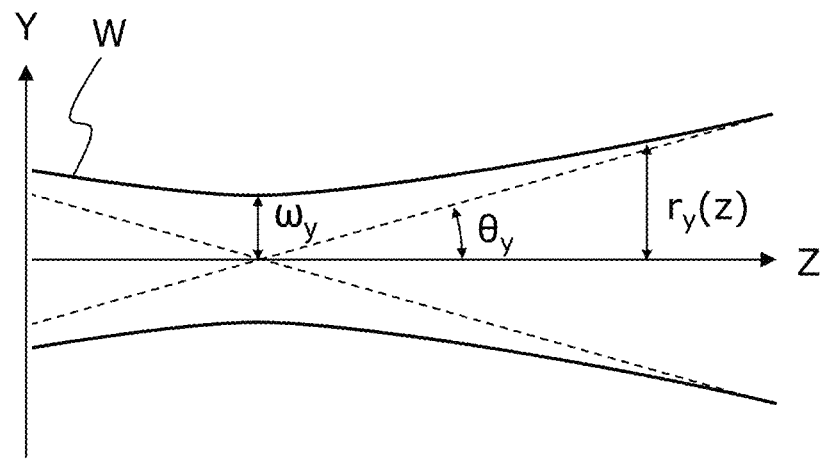
FIG. 10A is a cross-sectional view schematically showing a beam shape of a wavelength-combined beam W along the fast axis (the Y axis) direction.
Figure 10B:
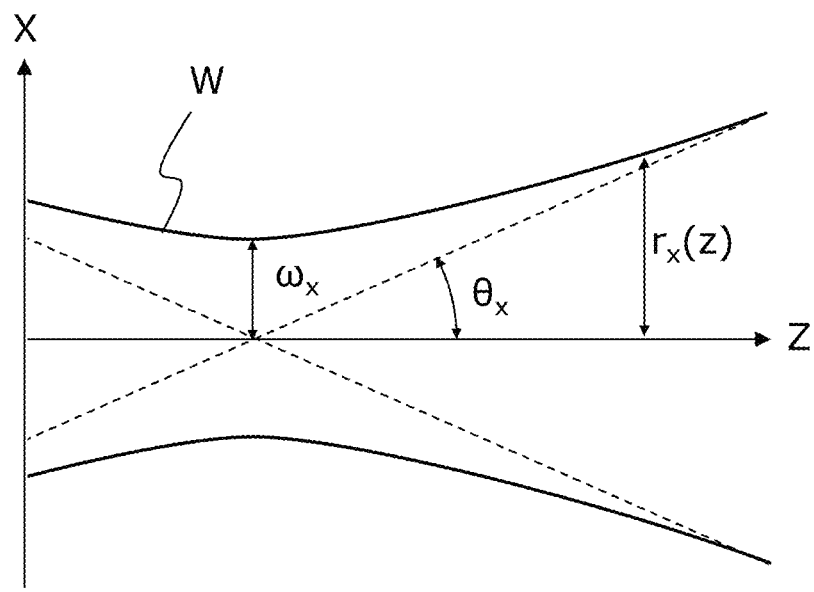
FIG. 10B is a cross-sectional view schematically showing a beam shape of a wavelength-combined beam W along the slow axis (the X axis) direction.

FIG. 10A is a cross-sectional view schematically showing a beam shape of the wavelength-combined beam W along the Y axis direction. FIG. 10B is a cross-sectional view schematically showing a beam shape of the wavelength-combined beam W along the X axis direction.

In the description below, the beam radius at the beam waist along the Y axis direction will be represented by $\omega_y$, and the divergence half angle in a far field will be represented by $\theta_y$. Similarly, the beam radius at the beam waist along the X axis direction will be represented by $\omega_x$, and the divergence half angle in a far field will be represented by $\theta_x$. In this case, in the Y axis direction, the wavelength-combined beam W can be approximated as a Gaussian beam. Therefore, the first BPP (unit: [mm·mrad]) along the Y axis direction, i.e., $\omega_y \times \theta_y$, is substantially equal to $\lambda/\Pi$. On the other hand, in the X axis direction, the wavelength-combined beam W cannot be approximated as a Gaussian beam, but can still be considered as a beam whose beam radius is enlarged from that of a Gaussian beam. The second BPP along the X axis direction is expressed as $\omega_y \times \theta_y = M^2 \times (\lambda/\Pi)$. When evaluating beam quality in light of a factor $M^2$ based on the 1$^{st}$ order Gaussian beam, $M^2$ can be regarded as about 1 regarding the Y axis direction. The $M^2$ regarding the X axis direction may be around 11, for example.

In the example described above, the first BPP along the Y axis (fast axis) direction was about 0.15 mm·mrad, and the second BPP along the X axis (slow axis) direction was about 1.43 mm·mrad. Therefore, at a position defined by an optical path length of 1000 mm, the beam diameter along the Y axis direction was about 2.91 mm, while the beam diameter along the X axis direction was about 4.45 mm. At a position defined by an optical path length of 2000 mm, the beam diameter along the Y axis direction was about 2.91 mm, while the beam diameter along the X axis direction was about 8.20 mm. Thus, in the X axis direction, the beam quality of the wavelength-combined beam W is relatively low, such that the beam greatly diverges in proportion to the optical path length.

According to a study by the inventors, the beam quality of the wavelength-combined beam W regarding the X axis (slow axis) direction is further degraded by the optical coupling device 30, thus resulting in a considerably lowered focusing ability onto the optical fiber 10. A decrease in beam quality, as described above, induces an enlargement of the spot diameter of the converged beam at the incident end surface of the optical fiber 10.

Figure 11:
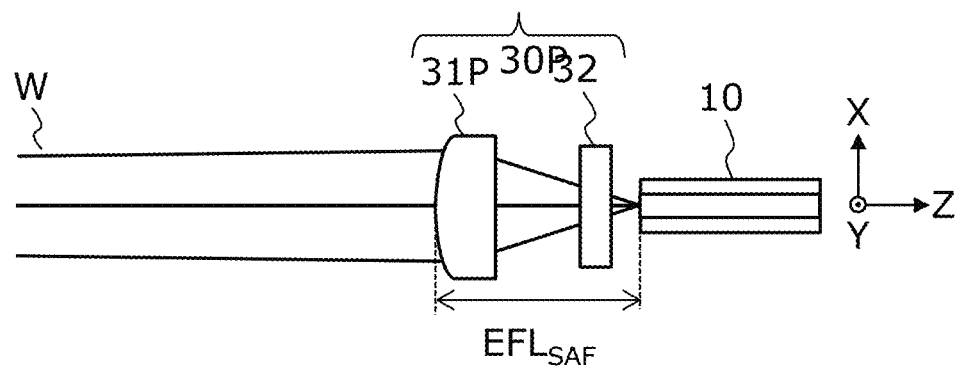
FIG. 11 is a cross-sectional view schematically showing enlarged the example of optical coupling device 30P in FIG. 1.

FIG. 11 is a diagram schematically showing the structure of an optical coupling device 30P according to Comparative Example. The optical coupling device 30P of this example includes a cylindrical lens 31P configured to focus light in a first plane (XZ) and a second cylindrical lens 32 configured to focus light in a second plane (YZ). The position of the image-side principal point of the cylindrical lens 31P is distant from the incident end surface of the optical fiber 10 by the focal length (effective focal length) EFL$_{SAF}$ of the cylindrical lens 31P. Therefore, due to the action of the cylindrical lens 31P, the wavelength-combined beam W having been incident on the cylindrical lens 31P is focused onto the incident end surface of the optical fiber 10. The BPP of the wavelength-combined beam W along the X axis direction is increased according to the spherical aberration of the cylindrical lens 31P, so that the beam diameter at the incident end surface of the optical fiber 10, as taken along the X axis direction, will be larger than the core diameter (e.g. 50 μm).

While the plurality of laser modules 24 are arranged so as to be inclined at every predetermined angle in the beam light source 20 according to the present embodiment, other appropriate configurations may be employed for the beam light source 20 according to the present disclosure. The plurality of laser modules 24 may be arranged so as to be parallel to one another, and the laser beams B emitted from the laser modules 24 may have their propagation directions deflected by dedicated mirrors, so as to be incident on the beam combiner 26 at different angles. Instead of using dedicated mirrors, the plurality of laser beams B propagate in parallel directions may be deflected by using a converging lens.

Optical Coupling Device

Hereinafter, an example of the structure of the optical coupling device 30 according to an embodiment of the present disclosure will be described.

Figure 12:
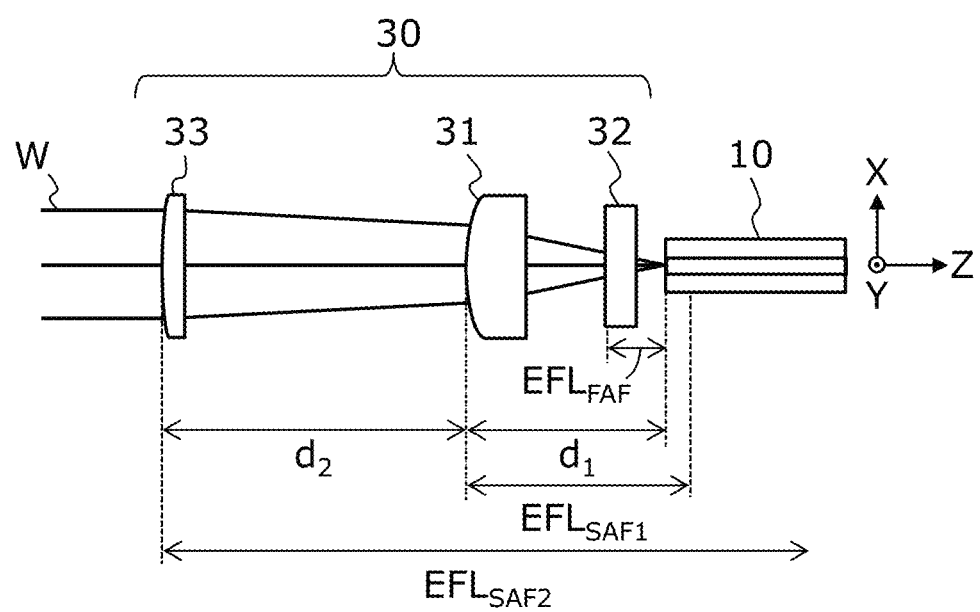
FIG. 12 is a cross-sectional view schematically showing enlarged an example of the structure of the optical coupling device 30 according to the present embodiment.

FIG. 12 is a cross-sectional view schematically showing enlarged an example of the structure of the optical coupling device 30 according to the present embodiment. Herein, the propagation direction of the wavelength-combined beam W extends along the Z axis; the slow axis is the X axis; and the fast axis is the Y axis. In this example, the optical coupling device 30 includes a first cylindrical lens 31 configured to focus light in a first plane (XZ), a second cylindrical lens 32 configured to focus light in a second plane (YZ), and a third cylindrical lens 33 configured to focus light in the first plane (XZ). The cylindrical lenses 31, 32 and 33 are all cylindrical planoconvex lenses, for example.

The first cylindrical lens 31, the second cylindrical lens 32, and the third cylindrical lens 33 respectively have a first focal length $EFL_{SAF1}$, a second focal length $EFL_{FAF}$, and a third focal length $EFL_{SAF2}$. The third focal length $EFL_{SAF2}$ is longer than the first focal length $EFL_{SAF1}$. In the present embodiment, the first focal length $EFL_{SAF1}$ is 75 mm, and the third focal length $EFL_{SAF2}$ is 300 mm. In view of reducing influences of spherical aberration associated with the third cylindrical lens 33, it is desirable that the third focal length $EFL_{SAF2}$ is equal to or greater than twice the first focal length $EFL_{SAF1}$. Although the second focal length $EFL_{FAF}$ is shorter than the first focal length $EFL_{SAF1}$ in the illustrated example, other appropriate configurations may be employed for embodiments of the present disclosure.

The beam shape and beam quality of the wavelength-combined beam W greatly differ between the first plane (XZ) and the second plane (YZ). In the present embodiment, focusing on the optical fiber 10 in the first plane (XZ), which is associated with a relatively large BPP, is achieved by the first and third cylindrical lenses 31 and 33. On the other hand, focusing on the optical fiber 10 in the second plane (YZ), which is associated with a relatively small BPP, is achieved by the second cylindrical lens 32 alone.

In the example shown in FIG. 12, the beam diameter of the wavelength-combined beam W in the first plane (XZ) is reduced by the auxiliary third cylindrical lens 33, and then the wavelength-combined beam W is incident on the first cylindrical lens 31. Because the spherical aberration of a lens increases in proportion to the third power of its beam diameter on the lens, reduction of the beam diameter on the first cylindrical lens 31 allows for reducing a decrease in beam quality caused by spherical aberration associated with the first cylindrical lens 31. The area of the first cylindrical lens 31 irradiated by the wavelength-combined beam W is smaller than an imaginary irradiated area in the case where the third cylindrical lens 33 is absent. The ratio of change in the first BPP of the wavelength-combined beam W due to passing through the first cylindrical lens 31 (rate of deterioration) is reduced as compared to Comparative Example shown in FIG. 11.

Moreover, with the third cylindrical lens 33 having a greater focal length ($EFL_{SAF2}$) than the focal length ($EFL_{SAF1}$) of the first cylindrical lens 31, a thin structure which is less prone to spherical aberration can be employed. Furthermore, since the wavelength-combined beam W having a relatively large beam divergence angle on the first plane (XZ) is first incident on the third cylindrical lens 33 before being incident on the first cylindrical lens 31, the incident beam diameter on the third cylindrical lens 33 can be reduced into a narrow range which is even less prone to spherical aberration. Thus, while hardly allowing a decrease in beam quality due to the third cylindrical lens 33 to occur, the problem of decreased beam quality due to the first cylindrical lens 31 can be solved. Accordingly, without employing an expensive aspherical lens, it is possible to reduce the focus beam diameter and enhance the efficiency of optical coupling to the optical fiber 10.

As shown in FIG. 12, provided that the distance between the position of the image-side principal point of the first cylindrical lens 31 and the incident end surface of the optical fiber 10 is referred to as d1, and the distance between the position of the image-side principal point of the third cylindrical lens 33 and the position of the image-side principal point of the first cylindrical lens 31 is referred to as d2, $d1<EFL_{SAF1}$ and $d2<EFL_{SAF2}$ hold true. When $d2<EFL_{SAF2}$ is satisfied, it can be regarded that the third cylindrical lens 33 assists in the reduction of convergence of the beam diameter on the first plane (XZ). In the example FIG. 12, $d1+d2<EFL_{SAF2}$ also holds true. In the present embodiment, d1 may be e.g., 50 mm, and d2 may be e.g., 150 mm. In order to reduce a decrease in beam quality due to spherical aberration associated with the third cylindrical lens 33, it is preferable that $EFL_{SAF2}$ is equal to or greater than twice $EFL_{SAF1}$, e.g., three times $EFL_{SAF1}$ or greater.

The area of the first cylindrical lens 31 irradiated by the wavelength-combined beam W is 75% or less (e.g. about 50% of the imaginary irradiated area in the case where the third cylindrical lens 33 is absent (Comparative Example as shown in FIG. 11). Due to reduction in the irradiated area, portions of the first cylindrical lens 31 that are less prone to spherical aberration can be utilized. However, if this irradiated area were excessively reduced, then the influences of spherical aberration associated with the third cylindrical lens 33 would be not negligible. Therefore, the area of the first cylindrical lens 31 irradiated by the wavelength-combined beam W is preferably equal to or greater than 40% of the imaginary irradiated area in the case where the third cylindrical lens 33 is absent (Comparative Example as shown in FIG. 11).

According to the present embodiment, the rate of change in the BPP (first beam parameter product) of the wavelength-combined beam W along the X axis direction due to passing through the first cylindrical lens 31 is within a range of 0% to 10%. In other words, a decrease in beam quality associated with the first cylindrical lens 31 is reduced to 10% or less.

In one embodiment, the beam diameter of the wavelength-combined beam W along the X axis direction when the wavelength-combined beam W is incident on the third cylindrical lens 33 is 5 mm or more (e.g. about 10 mm), whereas the beam diameter of the wavelength-combined beam W along the X axis direction when the wavelength-combined beam W is incident on the first cylindrical lens 31 is 2.5 mm or more (e.g. about 5 mm).

The wavelength-combined beam W generated in the Example described with reference to Table 1 was focused using the optical coupling device 30 shown in FIG. 12. The BPP of the wavelength-combined beam W along the X axis direction before being incident on the third cylindrical lens 33 was 1.43 mm·mrad. Even after passing through the optical coupling device 30, the beam quality of the wavelength-combined beam W was not deteriorated, and the BPP along the X axis direction remained at 1.43 mm·mrad; thus, the wavelength-combined beam W having a beam diameter of about 10 mm was focused onto a spot as small as 36 μm. On the other hand, when the optical coupling device 30P shown in FIG. 11 was used, the BPP along the X axis direction increased from 1.43 mm·mrad to 2.02 mm·mrad, and the beam diameter was focused to 56 μm. Thus, according to an embodiment of the present disclosure, the BPP along the X axis direction can be made smaller than 1.5 mm·mrad, and the wavelength-combined beam W can be coupled to an optical fiber having a core diameter of 50 μm with a high efficiency (e.g. about 85%).

While the optical coupling device 30 according to the present embodiment exhibits a great effect when used in combination with the beam light source 20 shown in FIG. 4, generation of the wavelength-combined beam W may be performed in a manner other than the example using the beam light source 20 of FIG. 4. The optical coupling device 30 is widely applicable as an optical coupling device for causing a combined beam, into which a plurality of laser beams have been combined, to be incident on an optical fiber. More specifically, when a first beam parameter product of a combined beam along a first direction, which is orthogonal to the propagation direction of the combined beam, is greater than a second beam parameter product along a second direction, which is orthogonal to both the propagation direction and the first direction, an increase in the first beam parameter product is suppressed and an excellent focusing ability is obtained.

Direct Diode Laser System

Figure 13:
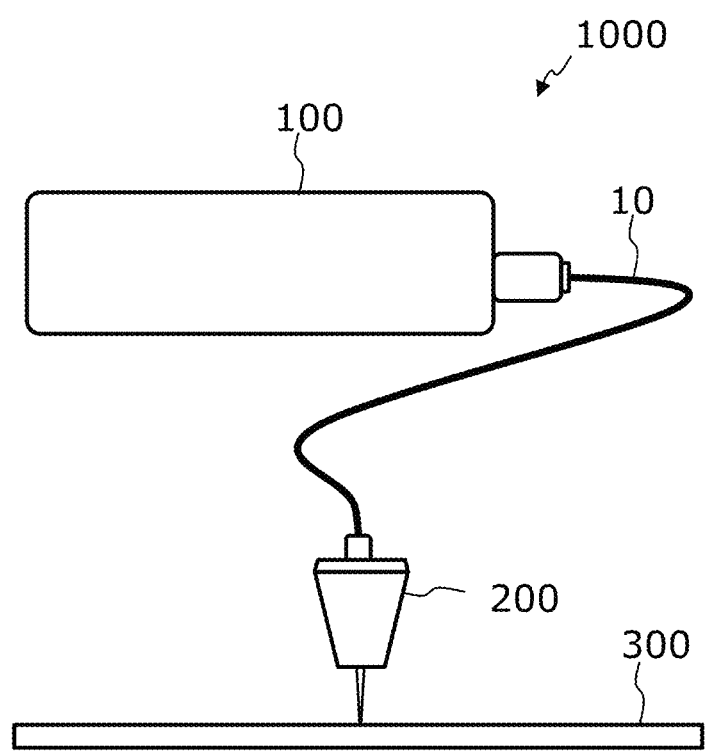
FIG. 13 is a diagram showing an example of the structure of a DDL system 1000 according to the present embodiment.

Next, with reference to FIG. 13, one embodiment of a direct diode laser (DDL) system according to the present disclosure will be described. FIG. 13 is a diagram showing an example of the structure of a DDL system 1000 according to the present embodiment.

The DDL system 1000 shown in FIG. 13 includes a light source device 100, and a processing head 200 connected to an optical fiber 10 which extends from the light source device 100. The processing head 200 irradiates a target object 300 with a wavelength-combined beam emitted from the optical fiber 10. In the example shown in FIG. 13, there is only one light source device 100.

The light source device 100 has a structure similar to the above-described structure. Any appropriate number of external cavity laser modules may be mounted in the light source device 100, and the number of external cavity laser modules mounted in the light source device 100 may be determined in accordance with the optical output power or irradiance that is needed. The wavelength of the laser light to be radiated from each external cavity laser module may also be selected in accordance with the material to be processed. For example, when processing copper, brass, aluminum or the like, LDs whose central wavelength is in the range of 350 nm to 550 nm may be preferably employed.

According to the present embodiment, a high-power laser beam is generated through wavelength beam combining, and is efficiency coupled onto an optical fiber, so that a high-fluence laser beam having high beam quality can be obtained with a high efficiency of energy conversion.

A light source device according to the present disclosure can be used for a wide range of applications where high-power and high-fluence laser light, having a high beam quality, is expected to be radiated from an optical fiber. The light source device and DDL system according to the present disclosure may be used in industrial fields where high-power laser light sources are needed, e.g., cutting or holing of various materials, localized heat treatments, surface treatments, metal welding, 3D printing, and the like.

What is claimed is:

1. A light source device comprising:
an optical fiber;
a beam light source configured to coaxially combine a plurality of laser beams of different peak wavelengths to generate and emit a collimated wavelength-combined beam, wherein a first beam parameter product of the collimated wavelength-combined beam along a first direction, which is orthogonal to a propagation direction of the collimated wavelength-combined beam, is greater than a second beam parameter product of the collimated wavelength-combined beam along a second direction, which is orthogonal to both the propagation direction and the first direction; and
an optical coupling device comprising:
a first cylindrical lens having a first focal length,
a second cylindrical lens having a second focal length, and
a third cylindrical lens having a third focal length greater than the first focal length, wherein:
the third cylindrical lens is configured to receive the collimated wavelength-combined beam from the beam light source, and to focus the collimated wavelength-combined beam in a first plane containing the propagation direction and the first direction,
the first cylindrical lens is configured to receive the wavelength-combined beam from the third cylindrical lens, and to focus the wavelength-combined beam in the first plane, and
the second cylindrical lens is configured to receive the wavelength-combined beam from the first cylindrical lens, to focus the wavelength-combined beam in a second plane containing the propagation direction and the second direction, and to cause the wavelength-combined beam to be incident on the optical fiber.

2. The light source device of claim 1, wherein a distance between the third cylindrical lens and the first cylindrical lens is shorter than the third focal length.

3. The light source device of claim 1, wherein an area of the first cylindrical lens irradiated by the wavelength-combined beam is 75% or less of an imaginary irradiated area of a case in which the third cylindrical lens is absent.

4. The light source device of claim 1, wherein a ratio of change in the first beam parameter product of the collimated wavelength-combined beam due to passing through the first cylindrical lens is within a range of 0% to 10%.

5. The light source device of claim 1, wherein:
the collimated wavelength-combined beam has a beam diameter of 5 mm or more along the first direction when incident on the third cylindrical lens; and
the wavelength-combined beam has a beam diameter of 2.5 mm or more along the first direction when incident on the first cylindrical lens.

6. The light source device of claim 1, wherein:
the beam light source comprises:
a plurality of external cavity laser modules configured to respectively emit the plurality of laser beams, and
a beam combiner configured to combine the plurality of laser beams to generate the collimated wavelength-combined beam.

7. The light source device of claim 6, wherein each of the plurality of external cavity laser modules comprises an external cavity and a laser diode.

8. The light source device of claim 7, wherein a lasing wavelength of the laser diode is in a range of 350 nm to 550 nm.

9. The light source device of claim 7, wherein the laser diode is accommodated in a semiconductor laser package that is sealed.

10. The light source device of claim 7, wherein each of the plurality of external cavity laser modules comprises a transmission diffraction grating and has a Littrow configuration.

11. A direct diode laser system comprising:
the light source device of claim 1; and
a processing head coupled to the optical fiber of the light source device, the processing head configured to irradiate a target object with the wavelength-combined beam emitted from the optical fiber.

12. An optical coupling device configured to receive a collimated combined beam into which a plurality of laser beams have been combined, wherein a first beam parameter product of the collimated combined beam along a first direction, which is orthogonal to a propagation direction of the collimated combined beam, is greater than a second beam parameter product of the collimated combined beam along a second direction, which is orthogonal to both the propagation direction and the first direction, the optical coupling device comprising:
a first cylindrical lens having a first focal length,
a second cylindrical lens having a second focal length, and
a third cylindrical lens having a third focal length greater than the first focal length, wherein:
the third cylindrical lens is configured to receive the collimated combined beam from a beam light source, and to focus the collimated combined beam in a first plane containing the propagation direction and the first direction,
the first cylindrical lens is configured to receive the combined beam from the third cylindrical lens, and to focus the combined beam in the first plane, and
the second cylindrical lens is configured to receive the combined beam from the first cylindrical lens, to focus the combined beam in a second plane containing the propagation direction and the second direction, and to cause the combined beam to be incident on an optical fiber.

13. The optical coupling device of claim 12, wherein a distance between the third cylindrical lens and the first cylindrical lens is shorter than the third focal length.

14. The optical coupling device of claim 12, wherein the third focal length is equal to or greater than twice the first focal length.

15. A light source device comprising:
an optical fiber;
a beam light source configured to coaxially combine a plurality of laser beams of different peak wavelengths to generate and emit a wavelength-combined beam; and
an optical coupling device configured to allow the wavelength-combined beam emitted from the beam light source to be incident on the optical fiber, wherein:
a first beam parameter product of the wavelength-combined beam along a first direction, which is orthogonal to a propagation direction of the wavelength-combined beam, is greater than a second beam parameter product of the wavelength-combined beam along a second direction, which is orthogonal to both the propagation direction and the first direction; and
the optical coupling device comprises:
a first cylindrical lens configured to focus the wavelength-combined beam in a first plane containing the propagation direction and the first direction, the first cylindrical lens having a first focal length,
a second cylindrical lens configured to focus the wavelength-combined beam in a second plane containing the propagation direction and the second direction, the second cylindrical lens having a second focal length, and
a third cylindrical lens configured to focus the wavelength-combined beam in the first plane so as to be incident on the first cylindrical lens, the third cylindrical lens having a third focal length greater than the first focal length,
wherein an area of the first cylindrical lens irradiated by the wavelength-combined beam is 75% or less of an imaginary irradiated area of a case in which the third cylindrical lens is absent.

16. A light source device comprising:
an optical fiber;
a beam light source configured to coaxially combine a plurality of laser beams of different peak wavelengths to generate and emit a wavelength-combined beam; and
an optical coupling device configured to allow the wavelength-combined beam emitted from the beam light source to be incident on the optical fiber, wherein:
a first beam parameter product of the wavelength-combined beam along a first direction, which is orthogonal to a propagation direction of the wavelength-combined beam, is greater than a second beam parameter product of the wavelength-combined beam along a second direction, which is orthogonal to both the propagation direction and the first direction; and
the optical coupling device comprises:
a first cylindrical lens configured to focus the wavelength-combined beam in a first plane containing the propagation direction and the first direction, the first cylindrical lens having a first focal length,
a second cylindrical lens configured to focus the wavelength-combined beam in a second plane containing the propagation direction and the second direction, the second cylindrical lens having a second focal length, and
a third cylindrical lens configured to focus the wavelength-combined beam in the first plane so as to be incident on the first cylindrical lens, the third cylindrical lens having a third focal length greater than the first focal length,
wherein a ratio of change in the first beam parameter product of the wavelength-combined beam due to passing through the first cylindrical lens is within a range of 0% to 10%.

17. A light source device comprising:
an optical fiber;
a beam light source configured to coaxially combine a plurality of laser beams of different peak wavelengths to generate and emit a wavelength-combined beam; and
an optical coupling device configured to allow the wavelength-combined beam emitted from the beam light source to be incident on the optical fiber, wherein:
a first beam parameter product of the wavelength-combined beam along a first direction, which is orthogonal to a propagation direction of the wavelength-combined beam, is greater than a second beam parameter product of the wavelength-combined beam along a second direction, which is orthogonal to both the propagation direction and the first direction; and
the optical coupling device comprises:
a first cylindrical lens configured to focus the wavelength-combined beam in a first plane containing the propagation direction and the first direction, the first cylindrical lens having a first focal length,
a second cylindrical lens configured to focus the wavelength-combined beam in a second plane containing the propagation direction and the second direction, the second cylindrical lens having a second focal length, and a third cylindrical lens configured to focus the wavelength-combined beam in the first plane so as to be incident on the first cylindrical lens, the third cylindrical lens having a third focal length greater than the first focal length, wherein the wavelength-combined beam has a beam diameter of 5 mm or more along the first direction when incident on the third cylindrical lens; and the wavelength-combined beam has a beam diameter of 2.5 mm or more along the first direction when incident on the first cylindrical lens.

* * * * *